(12) United States Patent
Chang et al.

(10) Patent No.: US 6,936,862 B1
(45) Date of Patent: Aug. 30, 2005

(54) LIGHT EMITTING DIODE PACKAGE

(75) Inventors: Chih-Chin Chang, Hsin-Chu (TW); Hsiang-Cheng Hsieh, Tao-Yuan Hsien (TW); Teng-Huei Huang, Hsin-Chu Hsien (TW)

(73) Assignee: Lighthouse Technology Co., LTD, Hsin-Chu Hsien (TW)

( * ) Notice: Subject to any disclaimer, the term of this patent is extended or adjusted under 35 U.S.C. 154(b) by 0 days.

(21) Appl. No.: 10/710,928

(22) Filed: Aug. 13, 2004

(30) Foreign Application Priority Data

May 20, 2004 (TW) ................................ 93114286 A

(51) Int. Cl.$^7$ ............................................. H01L 33/00
(52) U.S. Cl. ........................................ 257/100; 257/99
(58) Field of Search ........................ 257/79, 98, 100, 257/103, 99, 678, 710, 704

(56) References Cited

U.S. PATENT DOCUMENTS

| 6,069,440 A * | 5/2000 | Shimizu et al. | ............. 313/486 |
| 6,396,082 B1 * | 5/2002 | Fukasawa et al. | ............ 257/79 |
| 6,614,179 B1 * | 9/2003 | Shimizu et al. | ............. 313/512 |

\* cited by examiner

*Primary Examiner*—Howard Weiss
*Assistant Examiner*—(Vikki) Hoa B. Trinh
(74) *Attorney, Agent, or Firm*—Winston Hsu

(57) ABSTRACT

A light emitting diode package includes a light emitting diode device disposed in the light emitting diode package, and a molding material covering the light emitting diode device. The molding material includes a plurality of scatter supported wavelength converters. Portions of light beams emitted from the light emitting diode device incident to each of the scatter supported wavelength converters are scattered by each of the scatter supported wavelength converters and absorbed to excite each of the scatter supported wavelength converters to emit light in another wavelength.

19 Claims, 9 Drawing Sheets

LIGHT EMITTING DIODE PACKAGE

BACKGROUND OF INVENTION

1. Field of the Invention

The invention relates to a light emitting diode package, and more particularly, to a light emitting diode package having scatterer supported wavelength converters embedded in a molding material and having superior illumination uniformity and manufacturing convenience.

2. Description of the Prior Art

Recently, the new application fields of high illumination light emitting diodes (LEDs) have been developed. Different from a common incandescent light, a cold illumination LED has the advantages of low power consumption, long device lifetime, no idling time, and quick response speed. In addition, since the LED also has the advantages of small size, vibration resistance, being suitable for mass production, and being easily fabricated as a tiny device or an array device, it has been widely applied in display apparatuses and indicating lamps of information, communication, and consumer electronic products. The LEDs are not only utilized in outdoor traffic signal lamps or various outdoor displays, but also are very important components in the automotive industry. Furthermore, the LEDs also work well in portable products, such as cell phones and backlights of personal data assistants. The LED has become a necessary key component in the very popular liquid crystal display because it is the best choice when selecting the light source of the backlight module.

A common light emitting diode package comprises a light emitting diode device. The light emitting diode device is a light emitting device fabricated on a semiconductor material and has a positive terminal and a negative terminal. When a forward voltage is applied between the two terminals, the remaining energy caused by recombination of electrons and holes is excited and released in a form of light although only a small amount of current flows into the PN junction. The electrical energy is thus transferred to optical energy. When a reversed voltage is applied between the two terminals, the PN junction is reverse biased. Therefore, minority carriers are difficult to inject so that the light emitting diode device will not illuminate. When light is emitted from the light emitting diode device, a series of procedures including diffusing, reflecting, and mixing proceed in a molding material to generate satisfactory tone and brightness. Therefore, the geometry of the package and the selection of the molding material are important parameters when designing the light emitting diode package.

Please refer to FIG. 1. FIG. 1 is a schematic diagram of a prior art lead type light emitting diode package 10. As shown in FIG. 1, the prior art lead type light emitting diode package 10 comprises a light emitting diode chip 12, a mount lead 14, and an inner lead 16. The mount lead 14 further comprises a cup 18. The mount lead 14 is used as a negative electrode, and the inner lead 16 is used as a positive electrode. The light emitting diode chip 12 is disposed in the cup 18 of the mount lead 14. A P electrode and an N electrode (both are not shown in the figure) of the light emitting diode chip 12 are connected to the mount lead 14 and the inner lead 16, respectively, by conductive wires 22. The cup 18 is filled with a molding material 24 for encapsulation. A plurality of fluorescent materials (not shown) are spread in the molding material 24.

When light beams are emitted from the light emitting diode chip 12, portions of the light beams are absorbed by the fluorescent materials in the molding material 24 to excite the fluorescent materials such that light beams in another wavelength are generated. The fluorescent material thus functions as a wavelength converting material. By subtly mixing the light beams emitted from the light emitting diode chip 12 and light beams converted by one or a plurality of fluorescent materials, mixing light beams of white color or another color are eventually emitted. In order to obtain white light beams or mixing light beams with homogeneous tone by perfectly mixing light beams of different colors, the molding material 24 should not only comprise the fluorescent materials but also comprise many scattering materials (not shown) spread in it. Due to the existence of the scattering materials, the light beams emitted from the light emitting diode chip 12 are repetitively scattered and diffused to increase the emitting angle of the light beams emitted from the light emitting diode chip 12. Therefore, light beams having abrupt intensity are inhibited to become soft. In addition, the mixing light beams become very homogeneous. Furthermore, various additives for different objectives may be included in the molding material 24, according to practical requirements.

Please refer to FIG. 2. FIG. 2 is a schematic diagram of a prior art chip type light emitting diode package 50. As shown in FIG. 2, the prior art chip type light emitting diode package 50 comprises a light emitting diode chip 52 and a casing 54. The casing 54 further comprises a positive metal terminal 56 and a negative metal terminal 58. The positive metal terminal 56 is used as a positive electrode, and the negative metal terminal 58 is used as a negative electrode. The light emitting diode chip 52 is disposed in a recess 62 of the casing 54 and is on top of the positive metal terminal 56. A P electrode and all N electrode (both are not shown in the figure) of the light emitting diode chip 52 are connected to the positive metal terminal 56 and the negative metal terminal 58, respectively, by conductive wires 64. The recess 62 is filled with a molding material 66 for encapsulation. A plurality of fluorescent materials (not shown) are spread in the molding material 66.

When light beams are emitted from the light emitting diode chip 52, portions of the light beams are absorbed by one kind or more than one kind of the fluorescent materials in the molding material 66 to excite the fluorescent materials such that light beams in another wavelength or light beams in other wavelengths are generated. By controlling the mixing between the light beams emitted from the light emitting diode chip 52 and the light beams converted by the fluorescent materials, light beams emitted from the chip type light emitting diode package 50 become light beams of white color or another color. Similarly to the lead type light emitting diode package 10 shown in FIG. 1, the molding material 66 should not only comprise the fluorescent materials, but also should comprise many scattering materials (not shown) spread in it in order to obtain mixing light beams of white color or another color with homogeneous tone, by perfectly mixing light beams of different colors. The mixing light beams thus become very homogeneous. In addition, various additives for different objectives may be included in the molding material 66, according to practical requirements.

Both the lead type light emitting diode package 10 and the chip type light emitting diode package 50, as mentioned previously, can achieve the objective of color mixing so that light beams of white color or another color are generated. However, the lead type light emitting diode package 10 and the chip type light emitting diode package 50 have different packaging structures. Actually, different packaging structures will result in different illumination performance. No matter what kind of packaging structure is adapted, the final objective is to produce products having satisfactory whole tone homogeneity and brightness uniformity. When considering the uniformity issue, the molding material 24, 66 themselves become important points. Especially, whether the scattering materials in the molding materials 24, 66 can provide the products with superior uniformity becomes very important.

In the prior art, the fluorescent materials, the scattering materials, and other materials are usually mixed in a resin used for packaging. Therefore, all of these materials are embedded into the molding materials 24, 66. However, this method causes various problems when performing the mixing procedure. When different material particles are mixed in the resin used for packaging, an inhomogeneous mixing phenomenon tends to occur because different material particles have different weights, different shapes, different physical properties, and different chemical properties. Particularly, the scattering materials, usually in the form of particles or bubbles, always have this problem. Once this inhomogeneous phenomenon occurs, the whole tone homogeneity and brightness uniformity are affected.

Therefore, it is very important to develop a new molding material. The inhomogeneous phenomenon should be eliminated when this molding material is applied to different packaging structures. In addition, the fabrication should be convenient. The processing complexity should not be increased.

SUMMARY OF INVENTION

It is therefore a primary objective of the claimed invention to provide a light emitting diode package to resolve the above-mentioned problem.

According to the claimed invention, a lead type light emitting diode package is disclosed. The lead type light emitting diode package comprises a light emitting diode device disposed in the lead type light emitting diode package, and a molding material covering the light emitting diode device. A plurality of scatterer supported wavelength converters are included in the molding material. Portions of light beams emitted from the light emitting diode device incident to each of the scatterer supported wavelength converters are scattered by each of the scatterer supported wavelength converters, and portions of light beams emitted from the light emitting diode device incident to each of the scatterer supported wavelength converters are absorbed to excite each of the scatterer supported wavelength converters to emit light in another wavelength.

The present invention light emitting diode package embeds scatterer supported wavelength converters in the molding material, and each of the scatterer supported wavelength converters is a composite unit of the wavelength converting activator and the scatterer. The inhomogeneous phenomenon occurring during the mixing procedure is thus avoided because the problem that different material particles have different weights, different shapes, different physical properties, and different chemical properties does not exist any more. Therefore, not only are the satisfactory whole tone homogeneity and brightness uniformity achieved, but also the molding material embedded with the scatterer supported wavelength converters can be applied to various package structures. In addition, the manufacturing convenience is kept when performing packaging process so that processing complexity is not increased. Furthermore, the light emitting diode chip may be fixed on the high reflectivity surface in the present invention light emitting diode package by utilizing a non-conductive adhesive highly permeable to light to improve the amount of illumination of the front surface. Moreover, the light emitting diode chip and the diode chip may be anti in parallel with each other to achieve the objective of electrostatic charge protection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
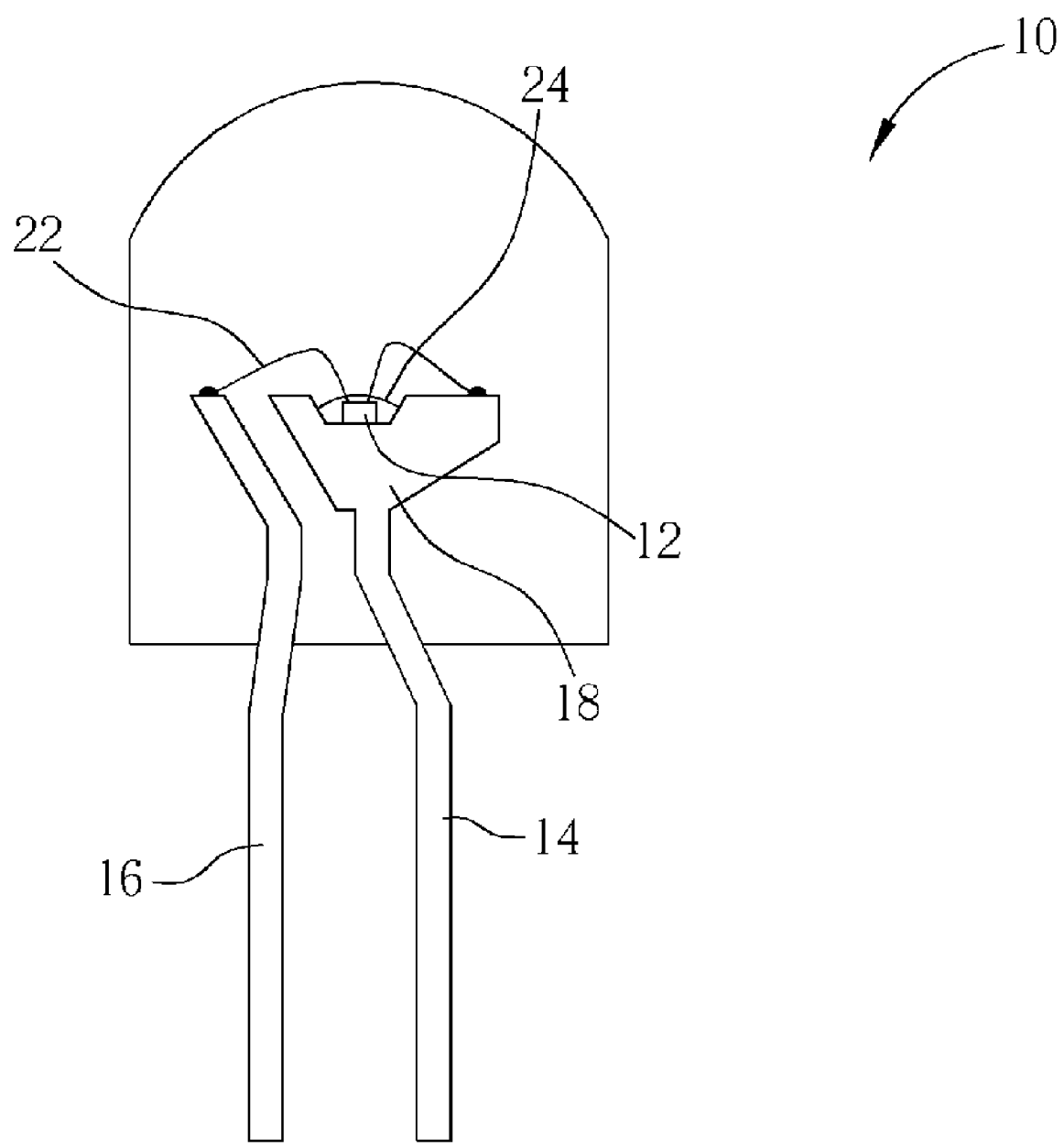
FIG. 1 is a schematic diagram of a prior art lead type light emitting diode package.
Figure 2:
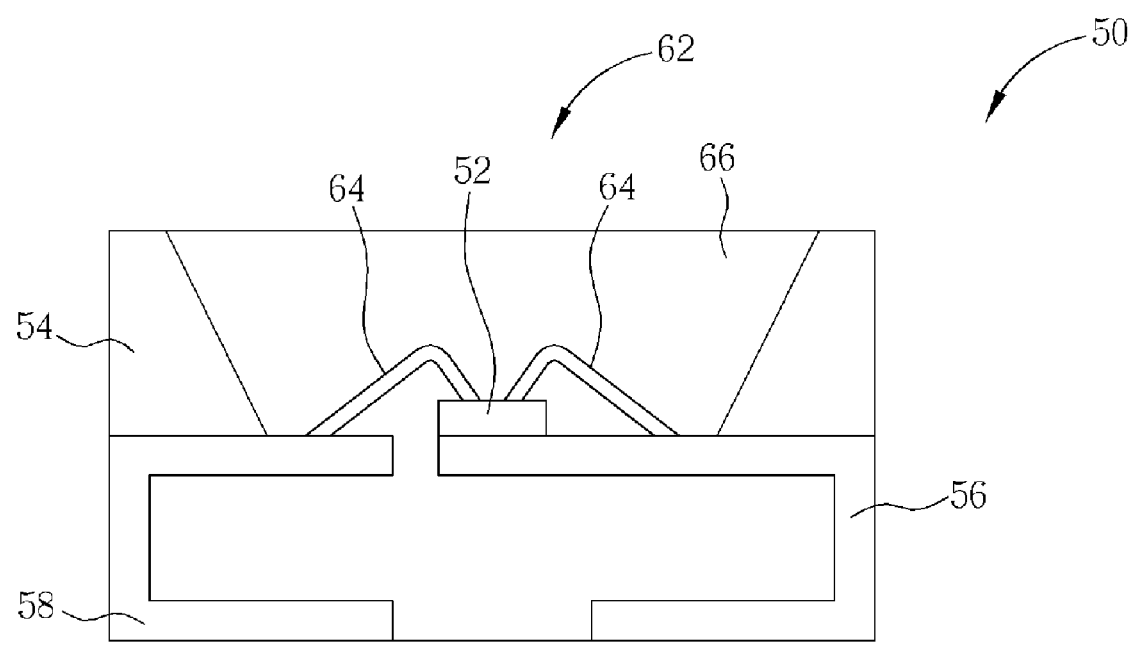
FIG. 2 is a schematic diagram of a prior art chip type light emitting diode package.
Figure 3:
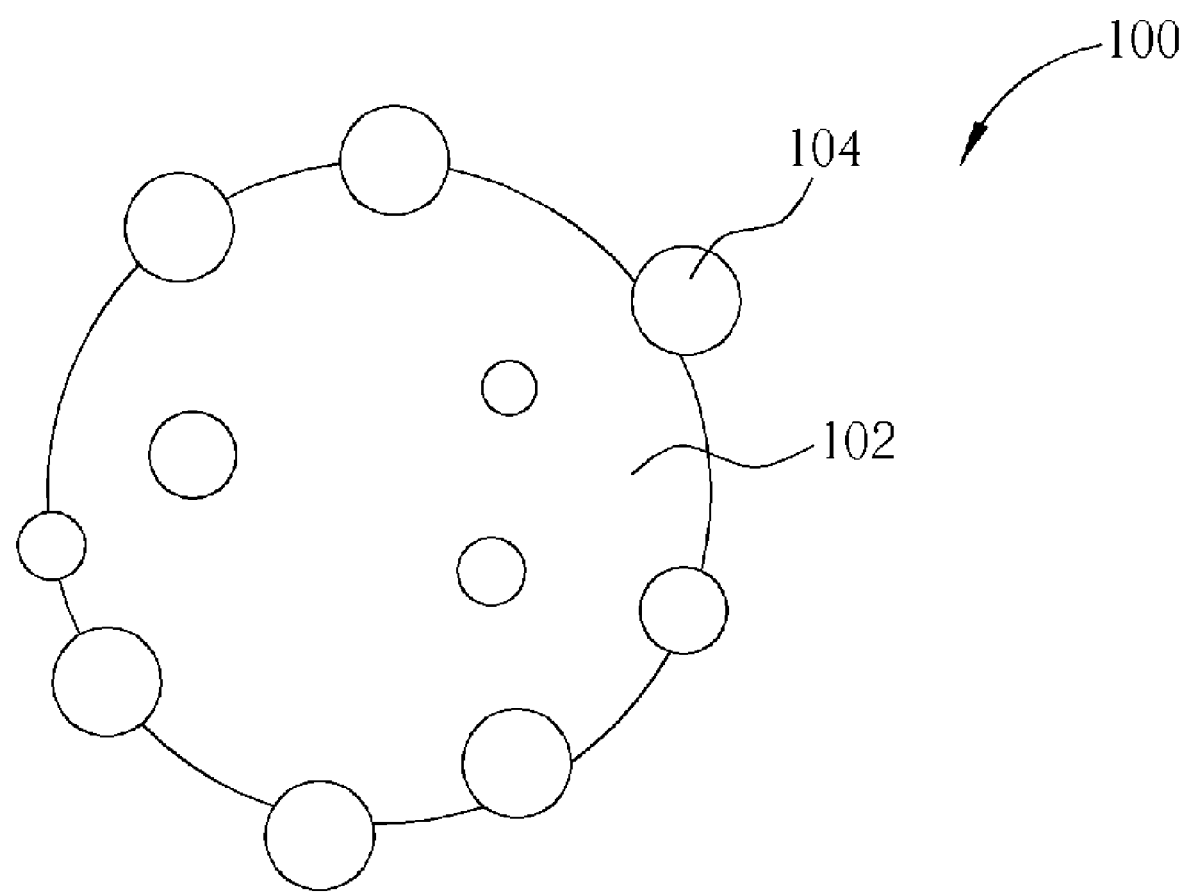
FIG. 3 is a schematic diagram of a scatterer supported wavelength converter according to a first preferred embodiment of the present invention.

Please refer to FIG. 3. FIG. 3 is a schematic diagram of a scatterer supported wavelength converter 100 according to a first preferred embodiment of the present invention. As shown in FIG. 3, the present invention scatterer supported wavelength converter 100 is a physical composite material or a chemical composite material. The scatterer supported wavelength converter 100 comprises a scatterer 102 and a plurality of wavelength converting activators 104 having a physical or chemical bonding therebetween. Each of the wavelength converting activators 104 adheres to portions of a surface of the scatterer 102. The wavelength converting activator 104 is a wavelength converting material, and the scatterer 102 is a scattering material for repetitively scattering and diffusing light beams. In addition, different phases may exist in the interface between the phase of the scatterer 102 and the phase of the wavelength converting activator 104.

Figure 4:
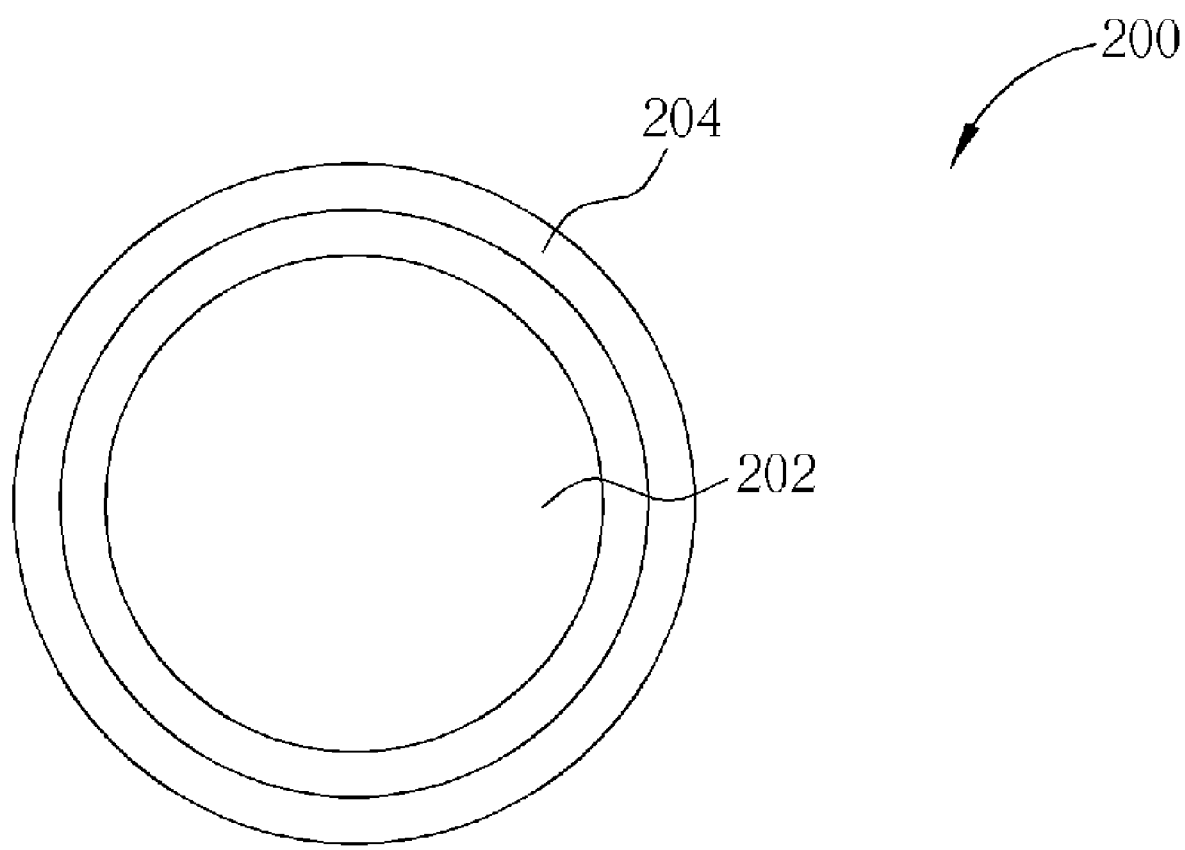
FIG. 4 is a schematic diagram of a scatterer supported wavelength converter according to a second preferred embodiment of the present invention.

Please refer to FIG. 4. FIG. 4 is a schematic diagram of a scatterer supported wavelength converter 200 according to a second preferred embodiment of the present invention. As shown in FIG. 4, the present invention scatterer supported wavelength converter 200 is a physical composite material or a chemical composite material. The scatterer supported wavelength converter 200 comprises a scatterer 202 and a wavelength converting activator 204 having a physical or chemical bonding therebetween. The scatterer 202 is encapsulated by the wavelength converting activator 204. The wavelength converting activator 204 is a wavelength converting material, and the scatterer 202 is a scattering material for repetitively scattering and diffusing light beams. In addition, different phases may exist in the interface between the phase of the scatterer 202 and the phase of the wavelength converting activator 204.

Figure 5:
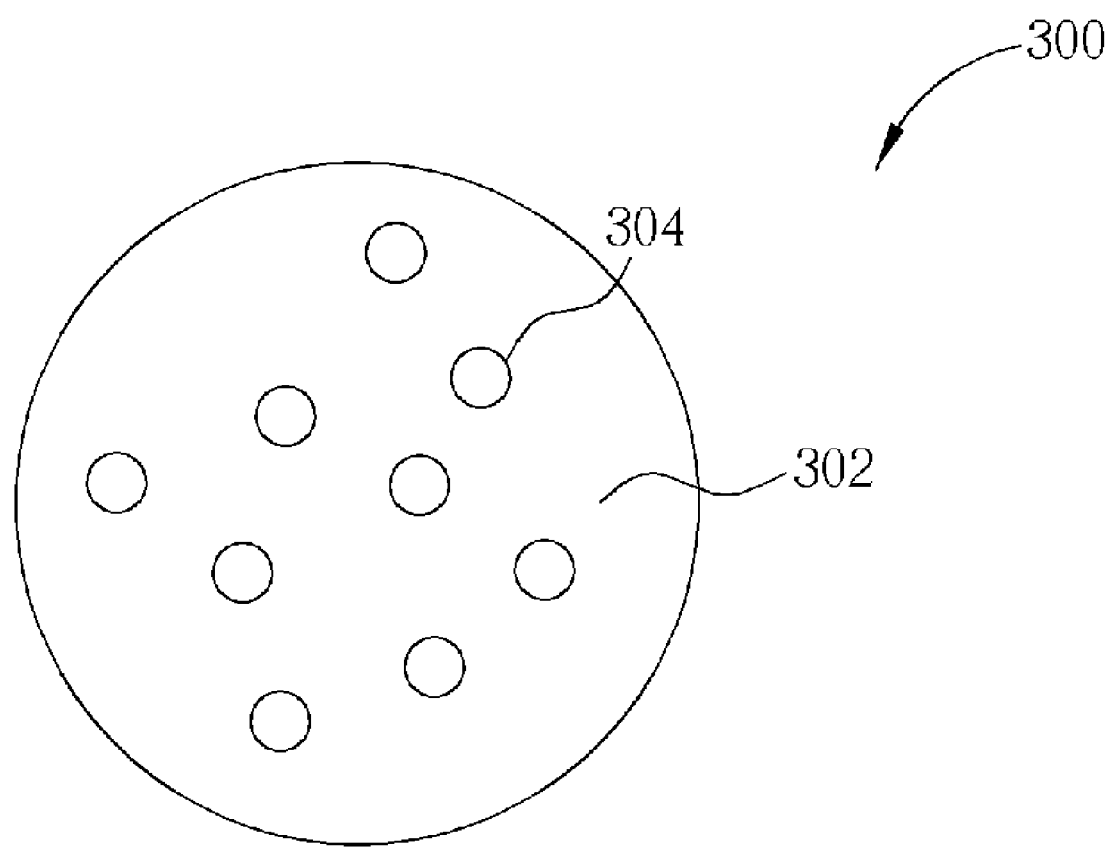
FIG. 5 is a schematic diagram of a scatterer supported wavelength converter according to a third preferred embodiment of the present invention.

Please refer to FIG. 5. FIG. 5 is a schematic diagram of a scatterer supported wavelength converter 300 according to a third preferred embodiment of the present invention. As shown in FIG. 5, the present invention scatterer supported wavelength converter 300 is a physical composite material or a chemical composite material. The scatterer supported wavelength converter 300 comprises a scatterer 302 and a plurality of wavelength converting activators 304 having a physical or chemical bonding therebetween. Each of the wavelength converting activators 304 is spread in the scatterer 302. The wavelength converting activator 304 is a wavelength converting material, and the scatterer 302 is a scattering material for repetitively scattering and diffusing light beams. In addition, different phases may exist in the interface between the phase of the scatterer 302 and the phase of the wavelength converting activator 304.

The wavelength converting activators 104, 204, 304 in the first, second, and third preferred embodiments of the present invention are all materials represented by a general formula (Y, Ce, Tb, Gd, Sc)$_{3+t+u}$(Al, Ga, Tl, In, B)$_{5+u+2v}$(O, S, Se)$_{12+2t+3u+3v}$(Ce, Tb)(where $0<t<5, 0<u<15, 0<v<9$). All of the scatterers 102, 202, 302 comprise an oxide, a sulphuret, or a selenium compound of at least one metal element selected from the above general formula. In fact, the present invention wavelength converting activators 104, 204, 304 and scatterers 102, 202, 302 are not limited to the above-mentioned materials. Any material having good wavelength converting characteristics and any material having a good scattering effect, which can be physically mixed to each other successfully or chemically combined together successfully to form the above-mentioned scatterer supported wavelength converters 100, 200, 300 are within the scope of the present invention. In addition, the wavelength converting activator of each of the scatterer supported wavelength converters 100, 200, 300 is not limited to one single material, and the scatterer of each of the scatterer supported wavelength converters 100, 200, 300 is not limited to one single material too. That means, the present invention scatterer supported wavelength converter may be a composite material composed of a plurality kinds of wavelength converting activators and one kind of scatterer, one kind of wavelength converting activator and a plurality kinds of scatterers, or a plurality kinds of wavelength converting activators and a plurality kinds of scatterers.

In the present invention, each of the scatterer supported wavelength converters 100, 200, 300 is mixed in a molding material. In addition, each individual scatterer supported wavelength converter 100, 200, 300 is a composite unit, as an integral particle, of the wavelength converting activator 104, 204, 304 and the scatterer 102, 202, 302, respectively. Therefore, the problem that different material particles have different weights, different shapes, different physical properties, and different chemical properties no longer exists for avoiding the inhomogeneous mixing phenomenon when performing the mixing procedure. It is worth noting that the molding material comprises an organic molding compound, a ceramic material permeable to light, a glass material permeable to light, an insulation fluid material permeable to light, or a composite material comprising at least two materials selected from a group consisting of the above-mentioned materials.

Figure 6:
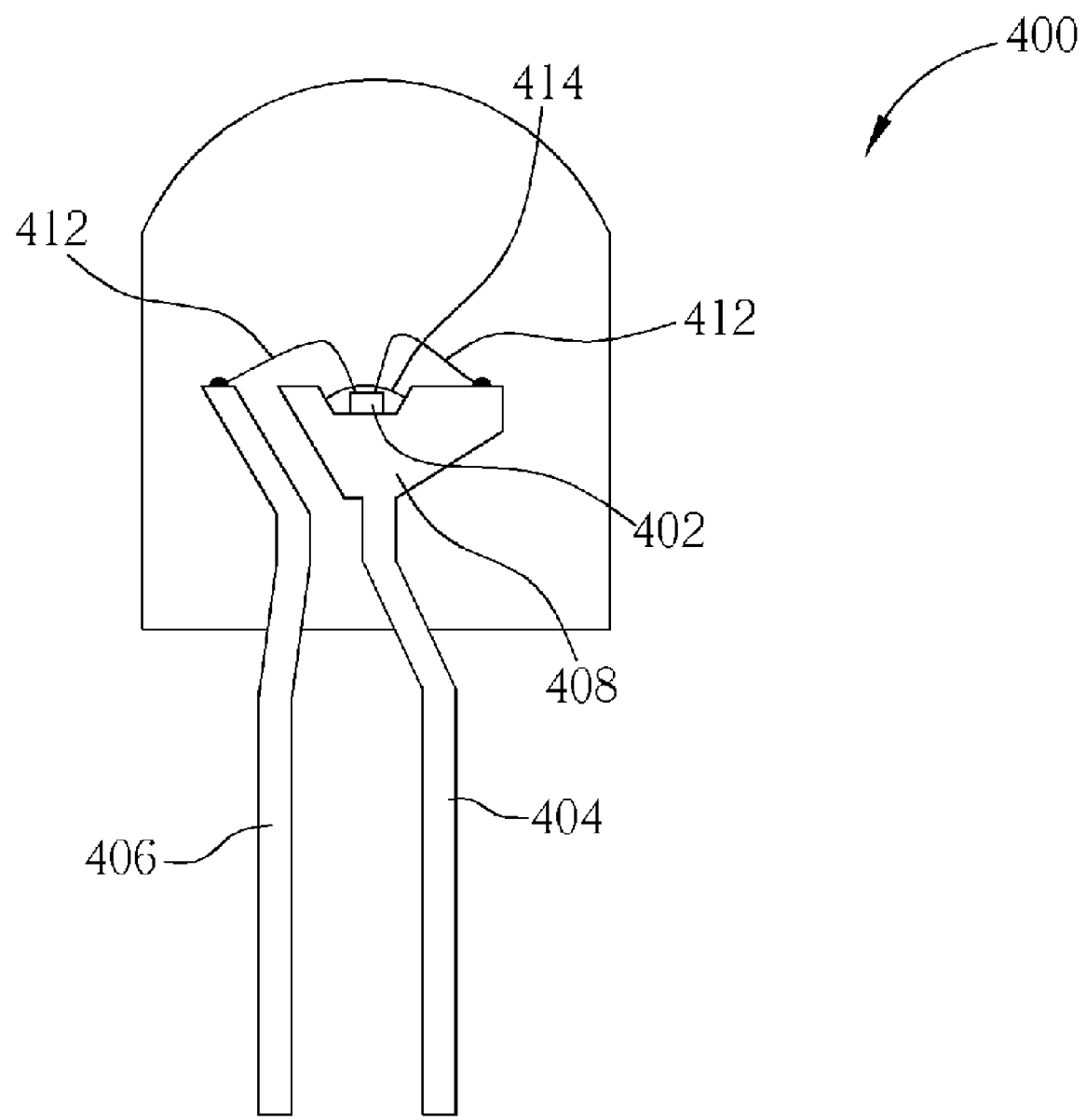
FIG. 6 is a schematic diagram of a present invention lead type light emitting diode package.

Please refer to FIG. 6. FIG. 6 is a schematic diagram of a present invention lead type light emitting diode package 400. As shown in FIG. 4, the present invention lead type light emitting diode package 400 comprises a light emitting diode chip 402, a mount lead 404, and an inner lead 406. The mount lead 404 further comprises a cup 408. The mount lead 404 is used as a negative electrode, and the inner lead 406 is used as a positive electrode. The light emitting diode chip 402 is disposed in the cup 408 of the mount lead 404. A P electrode and an N electrode (both are not shown in the figure) of the light emitting diode chip 402 are connected to the mount lead 404 and the inner lead 406, respectively, by conductive wires 412. The cup 408 is filled with a molding material 414 for encapsulatoin. A plurality of scatterer supported wavelength converters (not shown) are spread in the molding material 414. The scatterer supported wavelength converters may be any kind of scatterer supported wavelength converter disclosed in the present invention.

When light beams are emitted from the light emitting diode chip 402 and pass through the molding material 414, portions of the light beams are absorbed by the wavelength converting activators (not shown) of the scatterer supported wavelength converters to excite one or more than one wavelength converting materials such that light beams in another wavelength are generated (to convert blue light beams into yellow light beams). At the same time, portions of the light beams are repetitively scattered and diffused by the scatterers (not shown) of the scatterer supported wavelength converters to inhibit the light beams from having abrupt intensity. Finally, the above-mentioned light beams will mix with the light beams emitted from the light emitting diode chip 402 and are not converted at all to emit light beams of white color or another color. Since the scatterer supported wavelength converters are spread in the molding material 414 very evenly according to the present invention, the white light beams generated at last will have very superior tone homogeneity and brightness uniformity.

Figure 7:
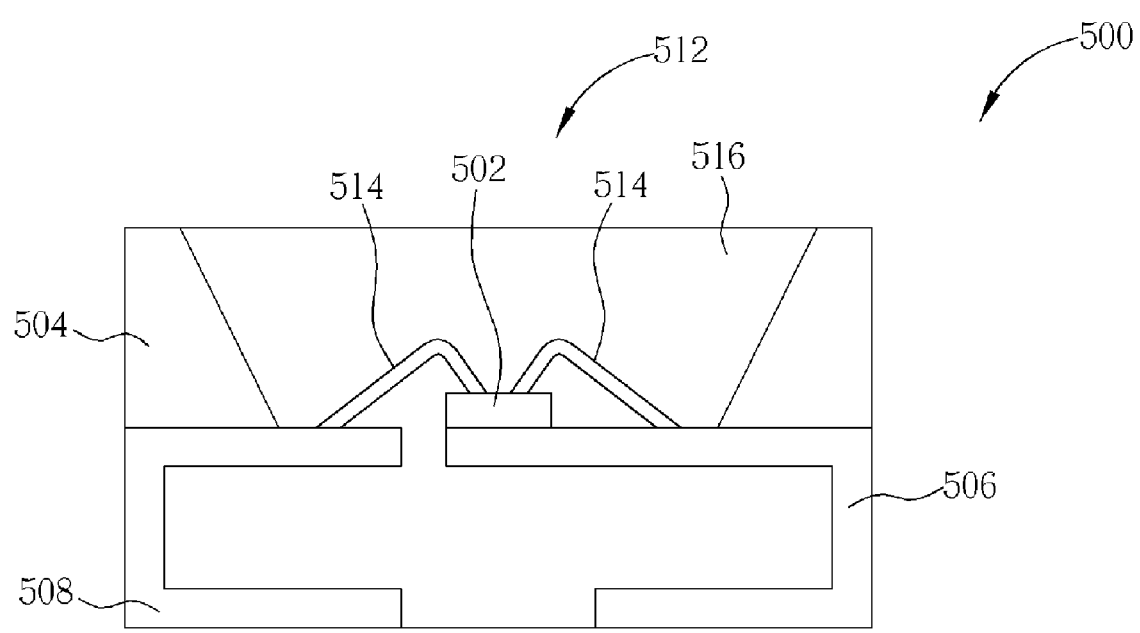
FIG. 7 is a schematic diagram of a present invention chip type light emitting diode package.

Please refer to FIG. 7. FIG. 7 is a schematic diagram of a present invention chip type light emitting diode package 500. As shown in FIG. 7, the present invention chip type light emitting diode package 500 comprises a light emitting diode chip 502 and a casing 504. The casing 504 further comprises a positive metal terminal 506 and a negative metal terminal 508. The positive metal terminal 506 is used as a positive electrode, and the negative metal terminal 508 is used as a negative electrode. The light emitting diode chip 502 is disposed in a recess 512 of the casing 504 and is on top of the positive metal terminal 506. A P electrode and an N electrode (both are not shown in the figure) of the light emitting diode chip 502 are connected to the positive metal terminal 506 and the negative metal terminal 508, respectively, by conductive wires 514. The recess 512 is filled with a molding material 516 for encapsulatoin. A plurality of scatterer supported wavelength converters (not shown) are spread in the molding material 516. The scatterer supported wavelength converters may be any kind of scatterer supported wavelength converter disclosed in the present invention.

When light beams are emitted from the light emitting diode chip 502 and pass through the molding material 516, portions of the light beams are absorbed by the wavelength converting activators (not shown) of the scatterer supported wavelength converters to excite one or more than one wavelength converting materials such that light beams in another wavelength are generated (to convert blue light beams into yellow light beams). At the same time, portions of the light beams are repetitively scattered and diffused by the scatterers (not shown) of the scatterer supported wavelength converters to inhibit the light beams from having abrupt intensity. Finally, the above-mentioned light beams will mix with the light beams emitted from the light emitting diode chip 502 and are not converted at all to emit light beams of white color or another color. Since the scatterer supported wavelength converters are spread in the molding material 516 very evenly according to the present invention, the white light beams generated at last will have very superior whole tone homogeneity and brightness uniformity.

Figure 8:
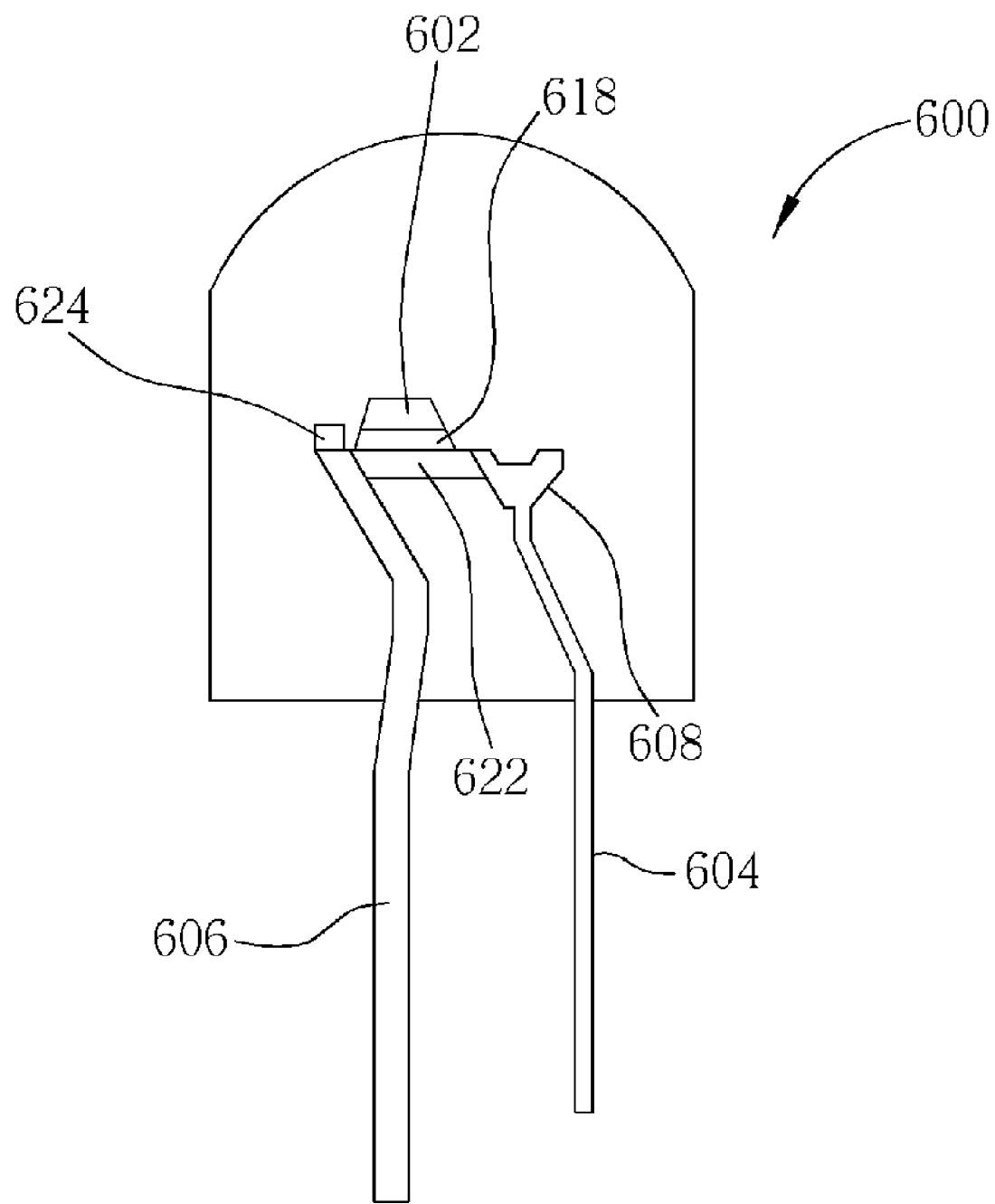
FIG. 8 is a schematic diagram of a present invention lead type light emitting diode package having a light emitting diode chip anti in parallel with a diode chip.

Since an LED itself tends to accumulate unexpected charges, electrostatic charges are thus generated. When a reverse biased voltage is applied on the LED, a punch through phenomenon occurs frequently. Due to the poor electrostatic charge protection ability of the LED, the LED is usually anti in parallel with a diode to improve the electrostatic charge protection ability of the LED. Please refer to FIG. 8. FIG. 8 is a schematic diagram of a present invention lead type light emitting diode package 600 having a light emitting diode chip 602 anti in parallel with a diode chip 624. As shown in FIG. 8, the present invention lead type light emitting diode package 600 comprises a light emitting diode chip 602, a mount lead 604, and an inner lead 606. The mount lead 604 further comprises a cup 608. The mount lead 604 is used as a negative electrode, and the inner lead 606 is used as a positive electrode. The light emitting diode chip 602 is not disposed on the mount lead 604 and the inner lead 606 (in other words, not disposed on the positive electrode and the negative electrode). Oppositely, the light emitting diode chip 602 is adhered to a high reflectivity surface 622 in the lead type light emitting diode package 600 by a non-conductive adhesive 618 permeable to light. When light beams are emitted from the light emitting diode chip 602, the light beams emitted downwards will first pass the non-conductive adhesive 618 permeable to light, and then are reflected by the high reflectivity surface 622. After that, the light beams optically react with wavelength converting activators and scatterers of scatterer supported wavelength converters (all are not shown in the figure). Therefore, the amount of font illumination of the light emitting diode chip 602 is improved to improve the brightness of the lead type light emitting diode package 600. In addition, two slant surfaces (not shown) may be disposed on the high reflectivity surface 622 to further improve the amount of illumination.

The lead type light emitting diode package 600 further comprises a diode chip 624 disposed on the inner lead 606. Both the light emitting diode chip 602 and the diode chip 624 comprises a P electrode and an N electrode. The light emitting diode chip 602 is anti in parallel with the diode chip 624 by wire bonding (not shown) the P electrodes and the N electrodes of the light emitting diode chip 602 and the diode chip 624. Furthermore, the light emitting diode chip 602 may be adhered on the mount lead 604 or the inner lead 606 by a non-conductive adhesive permeable to light, and a high reflectivity surface is disposed at bottom of the light emitting diode chip 602. Or, the diode chip 624 may be disposed on the mount lead 604, and the light emitting diode chip 602 is anti in parallel with the diode chip 624 by adequate wire bonding (not shown in the figure).

Figure 9:
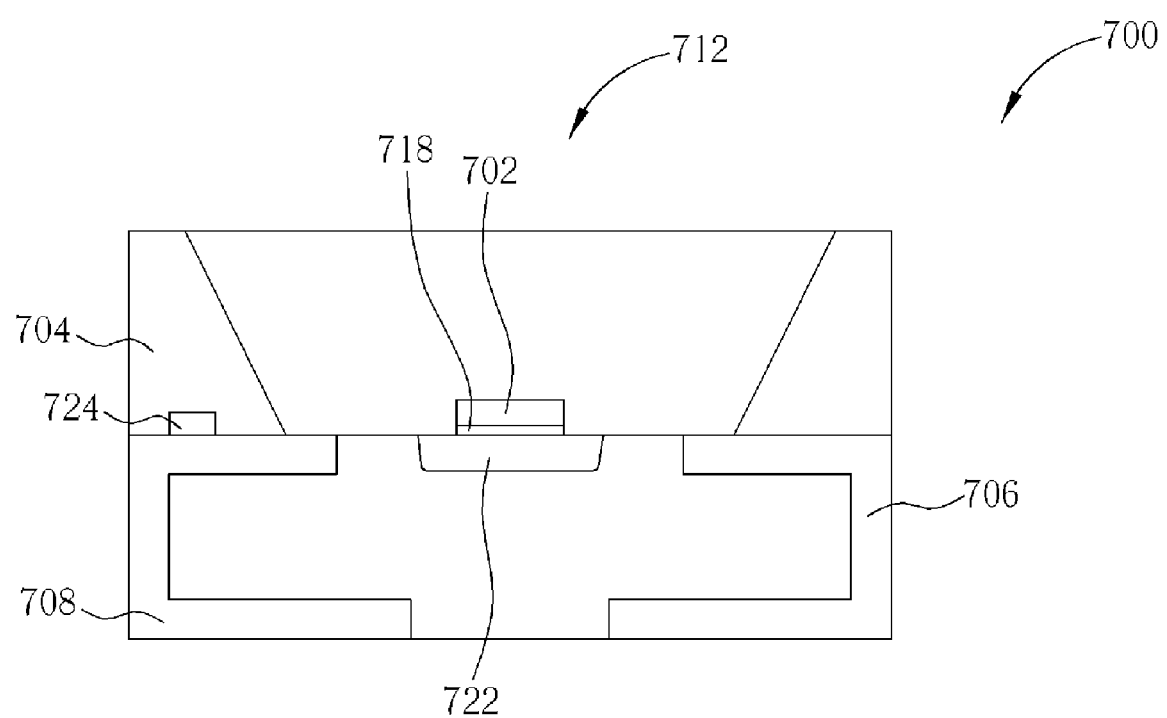
FIG. 9 is a schematic diagram of a present invention chip type light emitting diode package having a light emitting diode chip anti in parallel with a diode chip.

Please refer to FIG. 9. FIG. 9 is a schematic diagram of a present invention chip type light emitting diode package 700 having a light emitting diode chip 702 anti in parallel with a diode chip 724. As shown in FIG. 9, the present invention chip type light emitting diode package 700 comprises a light emitting diode chip 702 and a casing 704. The casing 704 further comprises a positive metal terminal 706 and a negative metal terminal 708. The positive metal terminal 706 is used as a positive electrode, and the negative metal terminal 708 is used as a negative electrode. The light emitting diode chip 702 is disposed in a recess 712 of the casing 704 and is not on top of the positive metal terminal 706 and the negative metal terminal 708 (in other words, not disposed on the positive electrode and the negative electrode). Oppositely, the light emitting diode chip 702 is adhered to a high reflectivity surface 722 in the chip type light emitting diode package 700 by a non-conductive adhesive 718 permeable to light. When light beams are emitted from the light emitting diode chip 702, the light beams emitted downwards will first pass the non-conductive adhesive 718 permeable to light and then are reflected by the high reflectivity surface 722. After that, the light beams optically react with wavelength converting activators and scatterers of scatterer supported wavelength converters (all are not shown in the figure). Therefore, the amount of front illumination of the light emitting diode chip 702 is improved to improve the brightness of the chip type light emitting diode package 700.

The chip type light emitting diode package 700 further comprises a diode chip 724 disposed on the negative metal terminal 708. Both the light emitting diode chip 702 and the diode chip 724 comprises a P electrode and an N electrode. The light emitting diode chip 702 is anti in parallel with the diode chip 724 by wire bonding (not shown) the P electrodes and the N electrodes of the light emitting diode chip 702 and the diode chip 724. Furthermore, the light emitting diode chip 702 may be adhered on the positive metal terminal 706 or the negative metal terminal 708 by a non-conductive adhesive permeable to light, and a high reflectivity surface is disposed at the bottom of the light emitting diode chip 702. Or, the diode chip 724 may be disposed on the positive metal terminal 706, and the light emitting diode chip 702 is anti in parallel with the diode chip 724 by adequate wire bonding (not shown in the figure).

It is worth noting that both the diode chips 624, 724, in coordination with the light emitting diode chips 602, 702 in FIG. 8 and FIG. 9, comprises a common diode chip, a Zenar diode chip, a Schottey diode chip, or a Transient Voltage Suppressor diode chip. In addition, blue fluorescent powders may be added into the molding material to absorb light beams having short wavelengths (395–450 nm) to emit blue light beams and excite scatterer supported wavelength converters to emit yellow light beams. After the light beams, light beams of white color or another color are generated. Under the circumstances, the light efficiency is further improved.

The present invention light emitting diode package embeds scatterer supported wavelength converters in the molding material, and each of the scatterer supported wavelength converters is a composite unit of the wavelength converting activator and the scatter. Therefore, the inhomogeneous mixing phenomenon occurring during the mixing procedure is effectively avoided. When applying the present invention light emitting diode package to a practical production line, products having good whole tone homogeneity, high brightness, and high electrostatic charge protection ability are produced.

In contrast to the prior art light emitting diode package, the present invention light emitting diode package embeds scatterer supported wavelength converters in the molding material, and each of the scatterer supported wavelength converters is a composite unit of the wavelength converting activator and the scatterer. The inhomogeneous phenomenon occurring during the mixing procedure is thus avoided because the problem that different material particles have different weights, different shapes, different physical properties, and different chemical properties does not exist any more. Not only are the satisfactory whole tone homogeneity and brightness uniformity achieved, but also the molding material embedded with the scatterer supported wavelength converters can be applied to various package structures. In addition, the manufacturing convenience is kept when performing packaging process so that processing complexity is not increased. Furthermore, the light emitting diode chip may be fixed on the high reflectivity surface in the present invention light emitting diode package by utilizing a non-conductive adhesive highly permeable to light to improve the amount of illumination of the front surface. Moreover, the light emitting diode chip and the diode chip may be anti in parallel with each other to achieve the objective of electrostatic charge protection.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A lead type light emitting diode package comprising:
   a light emitting diode device disposed in the lead type light emitting diode package; and
   an encapsulating material covering the light emitting diode device, wherein a plurality of scatter supported wavelength converter particles are distributed in the encapsulating material an each scatterer supported wavelength converter particle comprises one phase of scatterer and at least one phase of wavelength converting activator;
   wherein portions of light beams emitted from the light emitting diode device incident to each of the scatterer supported wavelength converter particles are scattered by each of the scatterer supported wavelength converter particles, and portions of light beams emitted from the light emitting diode device incident to each of the scatterer supported wavelength converter particles are absorbed to excite each of the scatterer supported wavelength converter particles to emit light in another wavelength, the lead type light emitting diode package thereby outputting light with improved brightness.

2. The lead type light emitting diode package of claim 1 wherein the encapsulating material comprises an organic molding compound, a ceramic material permeable to light, a glass material permeable to light, an insulation fluid material permeable to light, or a composite material comprising at least two materials selected from a group consisting of the above-mentioned materials.

3. The lead type light emitting diode package of claim 1 wherein the scatterer and the wavelength converting activator have a physical or chemical bonding to each other.

4. The lead type light emitting diode package of claim 1 wherein the wavelength converting activator is a material represented by a general formula $(A)_{3+t+u}(B)_{5+u+2v}(C)_{12+2t+3u+3v}$:D, where $0<t<5$, $0<u<15$, $0<v<9$, A is at least one selected from Y, Ce, Tb, Gd, and Sc, B is at least one selected from Al, Ga, Tl, In, and B, C is at least one selected from O, S, and Se, D is at least one selected from Ce and Tb, and the scatterer comprises an oxide, a sulphuret, or a selenium compound of at least one metal element selected from the above general formula.

5. The lead type light emitting diode package of claim 1 wherein the wavelength converting activator adheres to portions of a surface of the scatterer.

6. The lead type light emitting diode package of claim 1 wherein the scatterer is encapsulated by the wavelength converting activator.

7. The lead type light emitting diode package of claim 1 wherein the wavelength converting activator is spread in the scatterer.

8. The lead type light emitting diode package of claim 1 wherein the light emitting diode device is adhered to a high reflectivity surface in the lead type light emitting diode package by a non-conductive adhesive permeable to light.

9. The lead type light emitting diode package of claim 1 further comprising a first lead used as a positive electrode and a second lead used as a negative electrode.

10. The lead type light emitting diode package of claim 9 wherein one of the first lead and the second lead comprises a cup.

11. A chip type light emitting diode package comprising:
    a casing comprising a recess;
    a light emitting diode device disposed in the recess; and
    an encapsulating material covering the light emitting diode device, wherein a plurality of scatterer supported wavelength converter particles are distributed in the encapsulating material and each scatterer supported wavelength converter particle comprises one phase of scatterer and at least one phase of wavelength converting activator;
    wherein portions of light beams emitted from the light emitting diode device incident to each of the scatterer supported wavelength converter particles are scattered by each of the scatterer supported wavelength converter particles, and portions of light beams emitted from the light emitting diode device incident to each of the scatterer supported wavelength converter particles are absorbed to excite each of the scatterer supported wavelength converter particles to emit light in another wavelength, the chip type light emitting diode package thereby outputting light with improved brightness.

12. The chip type light emitting diode package of claim 11 wherein the encapsulating material comprises an organic molding compound, a ceramic material permeable to light, a glass material permeable to light, an insulation fluid material permeable to light, or a composite material comprising at least two materials selected from a group consisting of the above-mentioned materials.

13. The chip type light emitting diode package of claim 11 wherein the scatterer and the wavelength converting activator have a physical or chemical bonding to each other.

14. The chip type light emitting diode package of claim 11 wherein the wavelength converting activator is a material represented by a general formula $(A)_{3+t+u}(B)_{5+u+2v}(C)_{12+2t+3u+3v}$:D, where $0<t<5$, $0<u<15$, $0<v<9$, A is at least one selected from Y, Ce, Tb, Gd, and Sc, B is at least one selected from Al, Ga, Tl, In, and B, C is at least one selected from O, S, and Se, D is at least one selected from Ce and Tb, and the scatterer comprises an oxide, a sulphuret, or a selenium compound of at least one metal element selected from the above general formula.

15. The chip type light emitting diode package of claim 11 wherein the wavelength converting activator adheres to portions of a surface of the scatterer.

16. The chip type light emitting diode package of claim 11 wherein the scatterer is encapsulated by the wavelength converting activator.

17. The chip type light emitting diode package of claim 11 wherein the wavelength converting activator is spread in the scatterer.

18. The chip type light emitting diode package of claim 11 wherein the light emitting diode device is adhered to a high reflectivity surface in the chip type light emitting diode package by a nonconductive adhesive permeable to light.

19. The chip type light emitting diode package of claim 11 further comprising a positive electrode and a negative electrode in the case.

* * * * *